(12) United States Patent
Hirata (10) Patent No.: US 6,796,826 B2
(45) Date of Patent: Sep. 28, 2004

(54) PIN GRID ARRAY PACKAGE SOCKET

(75) Inventor: Toshihisa Hirata, Yamato (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/467,250

(22) PCT Filed: Feb. 14, 2002

(86) PCT No.: PCT/US02/04422
§ 371 (c)(1),
(2), (4) Date: Aug. 5, 2003

(87) PCT Pub. No.: WO02/065591
PCT Pub. Date: Aug. 22, 2002

(65) Prior Publication Data
US 2004/0063350 A1 Apr. 1, 2004

(30) Foreign Application Priority Data
Feb. 14, 2001 (JP) .................................. 2001-036927

(51) Int. Cl.⁷ ............................................... H01R 4/50
(52) U.S. Cl. ...................................... 439/342; 439/266
(58) Field of Search .................... 439/342, 266, 439/265, 330, 331, 259, 260, 261, 262, 296; 324/755, 72.5

(56) References Cited

U.S. PATENT DOCUMENTS 4,950,980 A * 8/1990 Pfaff ........................... 324/755
6,280,224 B1 * 8/2001 Huang ......................... 439/342

\* cited by examiner

Primary Examiner—Alex Gilman
(74) Attorney, Agent, or Firm—Robert J. Zeitler (57) ABSTRACT

Disclosed is an improved PGA package socket comprising a generally planar base housing having a plurality of terminals arranged in the form of grid array, and a generally planar slide plate having a corrresponding plurality of through holes arranged in the same form of grid array as the generally planar base housing. The slide plate is placed on the generally planar base housing, and the generally planar base housing has a generally cylindrical cam member fitted on a pivot axle, which passes through the slide plate to stand upright on the front end of the base housing whereby clockwise or counterclockwise rotation of the cam member about is pivot axle makes the slide plate move back and forth between an open position and a closed position. The generally planar base housing has a traversal section formed in the vicinity of the pivot axle, thereby allowing the front end of the slide plate to be positioned under the traversal section while moving between the opening position and the locking position, thereby preventing the slide plate from coming up from the base housing.

19 Claims, 8 Drawing Sheets

PIN GRID ARRAY PACKAGE SOCKET

FIELD OF THE INVENTION

The present invention relates to a pin grid array ("PGA") package socket for use in connecting a PGA package to a given electric circuit.

BACKGROUND OF THE INVENTION

Conventional PGA sockets comprise a generally planar base housing having a plurality of terminals arranged in the form of grid, and a generally planar slide plate having a corresponding plurality of through holes arranged in the same form of grid as the generally planar base housing. The slide plate is placed on the base housing, and the base housing has a cylindrical cam member fitted on a pivot axle which passes through the slide plate, standing upright on the front end of the base housing, whereby clockwise or counterclockwise rotation of the cam member about its pivot axle makes the slide plate move back and forth between the opening position in which the lead pins of the PGA package can be inserted in the through holes to reach the terminal mounts and the locking position in which the inserted lead pins are put in engagement with the terminals.

Figure 10:
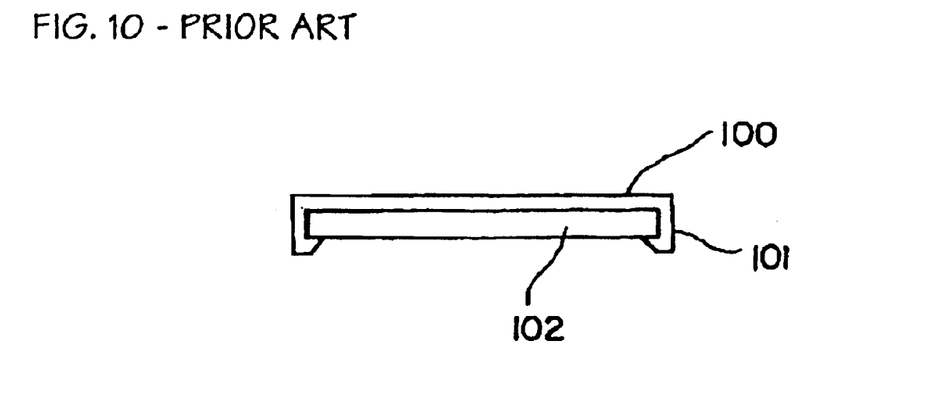
FIG. 10 shows a conventional PGA socket whose slide plate and base housing are combined together with the snapping hooks of the overlying slide plate.

It is necessary that the slide plate be closely laid on the base housing, not allowing the slide plate to come up whether it slides on the base housing or stays thereon. Referring to FIG. 10, in conventional PGA sockets, in order to assure that the slide plate 100 does not come up from the base housing 102 the slide plate 100 is designed to have hooks 101 formed on its opposite longitudinal sides to catch the opposite longitudinal sides of the underlying base housing 102 by snapping the slide plate 100 into its place. This rise-proof arrangement, however, requires application of a relatively strong force to the overlying slide plate. Apparently application of such a pushing force to the slide plate is disadvantageous to assembling work, and is one cause for lowering the assembling efficiency.

SUMMARY OF THE INVENTION

One object of the present invention is to provide a PGA package socket which does not require application of any force in fixing the slide plate to the base housing.

To attain this object, a conventional PGA package socket is improved according to the present invention in that the base housing has a traversal section formed in the vicinity of the pivot axle, thereby allowing the front end of the slide plate to be positioned under the traversal section while moving between the opening position and the locking position, thereby preventing the slide plate from coming up from the base housing.

With this arrangement the generally planar slide plate can be combined with the generally planar base housing simply by placing the slide plate on the base housing and by positioning the slide plate on the base housing until the forward end of the slide plate has been positioned under the traversal section of the base housing.

The cam member may have a radial retainer projecting from its lower part, and the base housing may have shoulders formed on the opposite sides of the pivot axle, thus limiting the rotation of the cam member to the range defined by the opposite shoulders.

The generally planar slide plate may additionally have a means for retaining the cam member to the pivot axle. One such means includes a resilient member engaging the radial retainer of the cam member appearing in the aperture through which the cam member passes, thereby retaining the cam member to the pivot axle.

The cam member may have a hook-ended axle formed at its center, and the cam member is rotatably fixed to the base housing with the hooks of the center axle being caught by the bottom of the base housing.

The base housing and slide plate may also have interengaging members for preventing the back end of the slide plate from coming up from the base housing.

BRIEF DESCRIPTION OF THE ACCOMPANYING DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 1(a) is a longitudinal section of a fragment of a PGA package socket taken along the line A—A in FIG. 2, illustrating the actuating parts of the socket with no cam member mounted, whereas FIG. 1(b) is another longitudinal section of the fragment of the PGA package with the cam member mounted;

FIG. 5 is a perspective view of the front, thick end of the base housing, illustrating how the radial retainer of the cam member and the opposite shoulders of the base housing are like;

DESCRIPTION OF THE PREFERRED EMBODIMENTS

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

Figure 1:
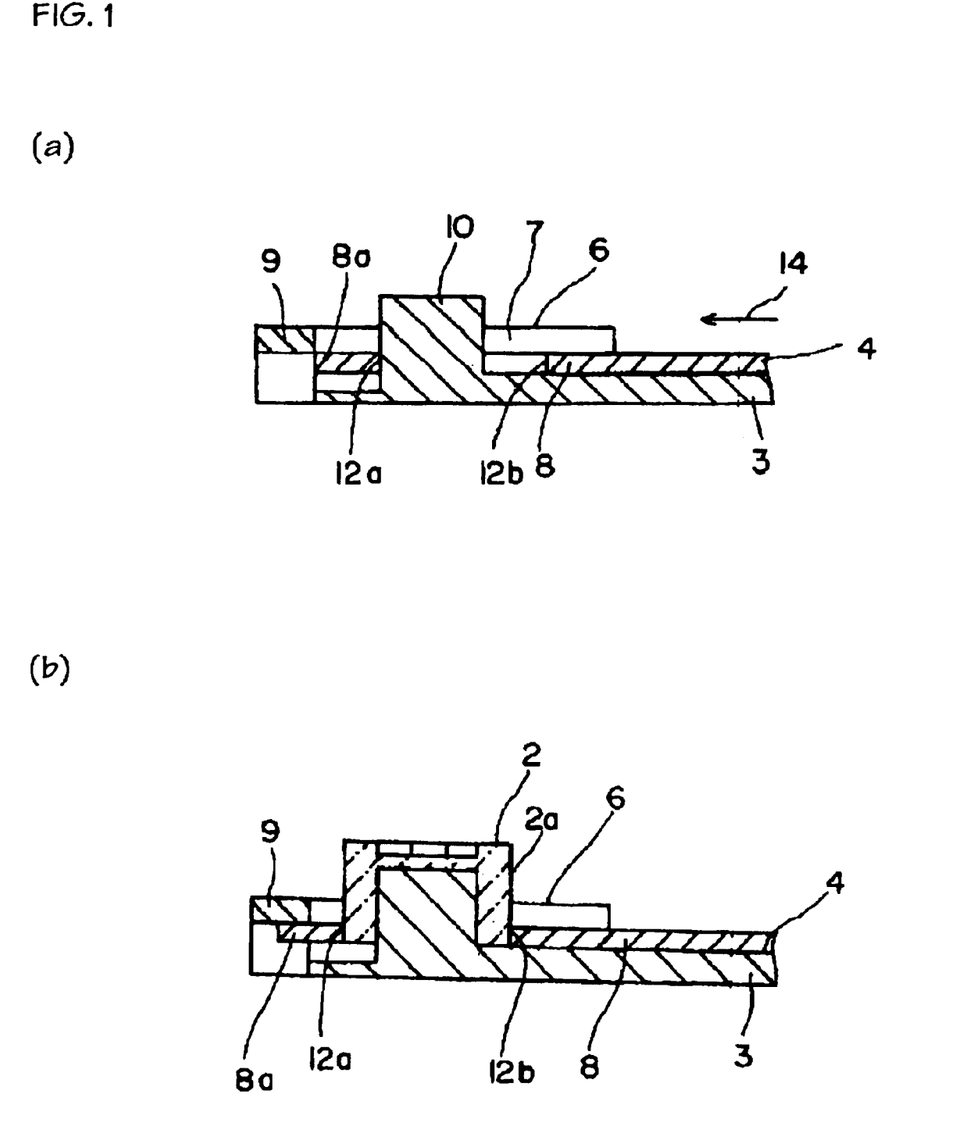
Figure 2:
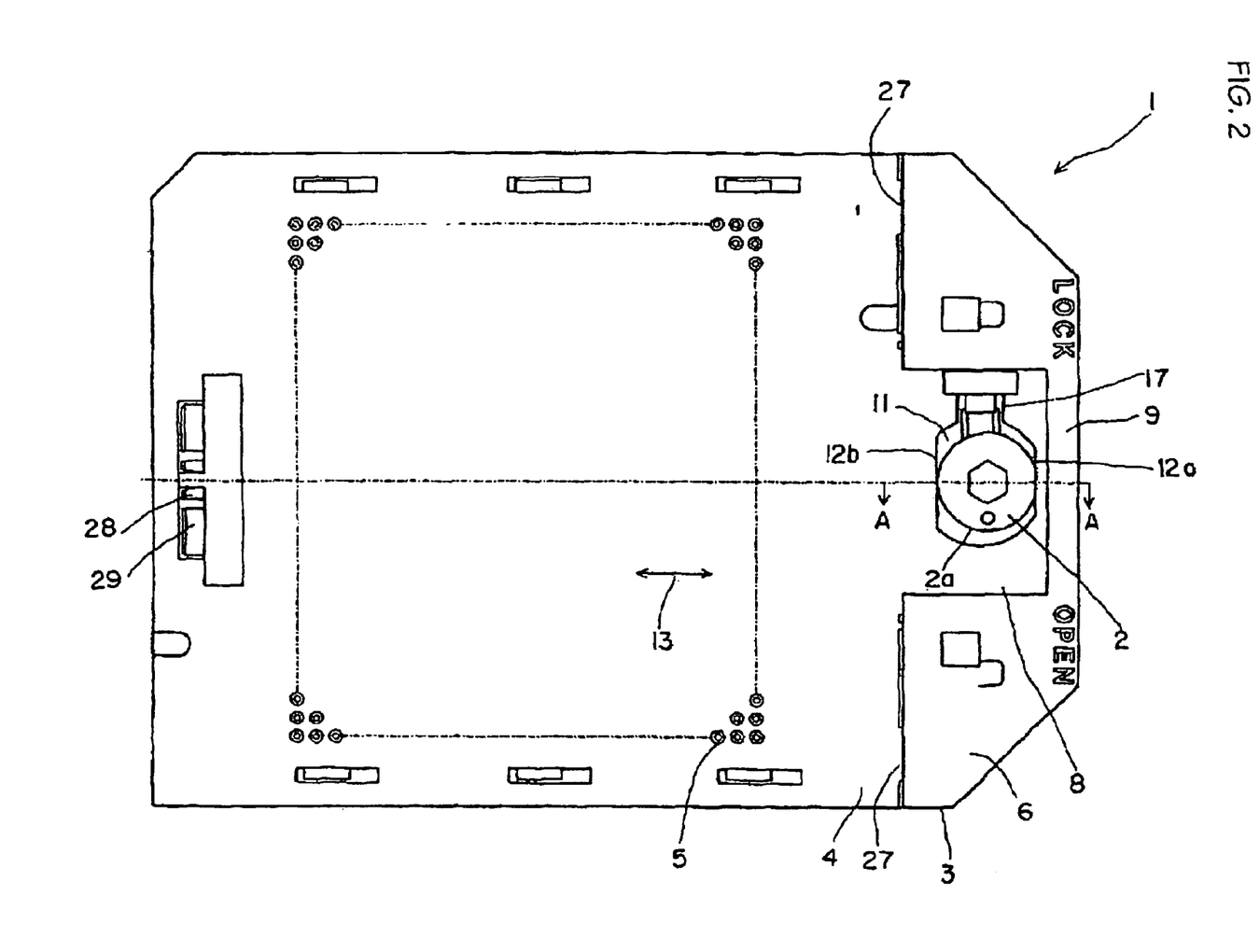
FIG. 2 is a plane view of the PGA socket.

Referring to FIGS. 1 and 2, a PGA package socket 1 to which the present invention can be applied comprises a generally planar base housing 3 having a plurality of terminals arranged in the form of grid array, and a generally planar slide plate 4 having a corresponding plurality of through holes 5 arranged in the same form of grid array as the generally planar base housing 3. The base housing and the slide plate are preferably made of an insulative material.

The slide plate 4 is slidably laid on the base housing 3, and the base housing 3 has a generally cylindrical cam member 2 fitted on a pivot axle 10, which passes through the slide plate 4, standing upright on the front end of the base housing 3. The clockwise or counterclockwise rotation of the cam member about its pivot axle makes the slide plate 4 move back and forth between the opening position in which the lead pins of a PGA package can be inserted in the through holes 5 to reach the terminal mounts and the locking position in which the inserted lead pins are put in engagement with the terminals.

Figure 3:
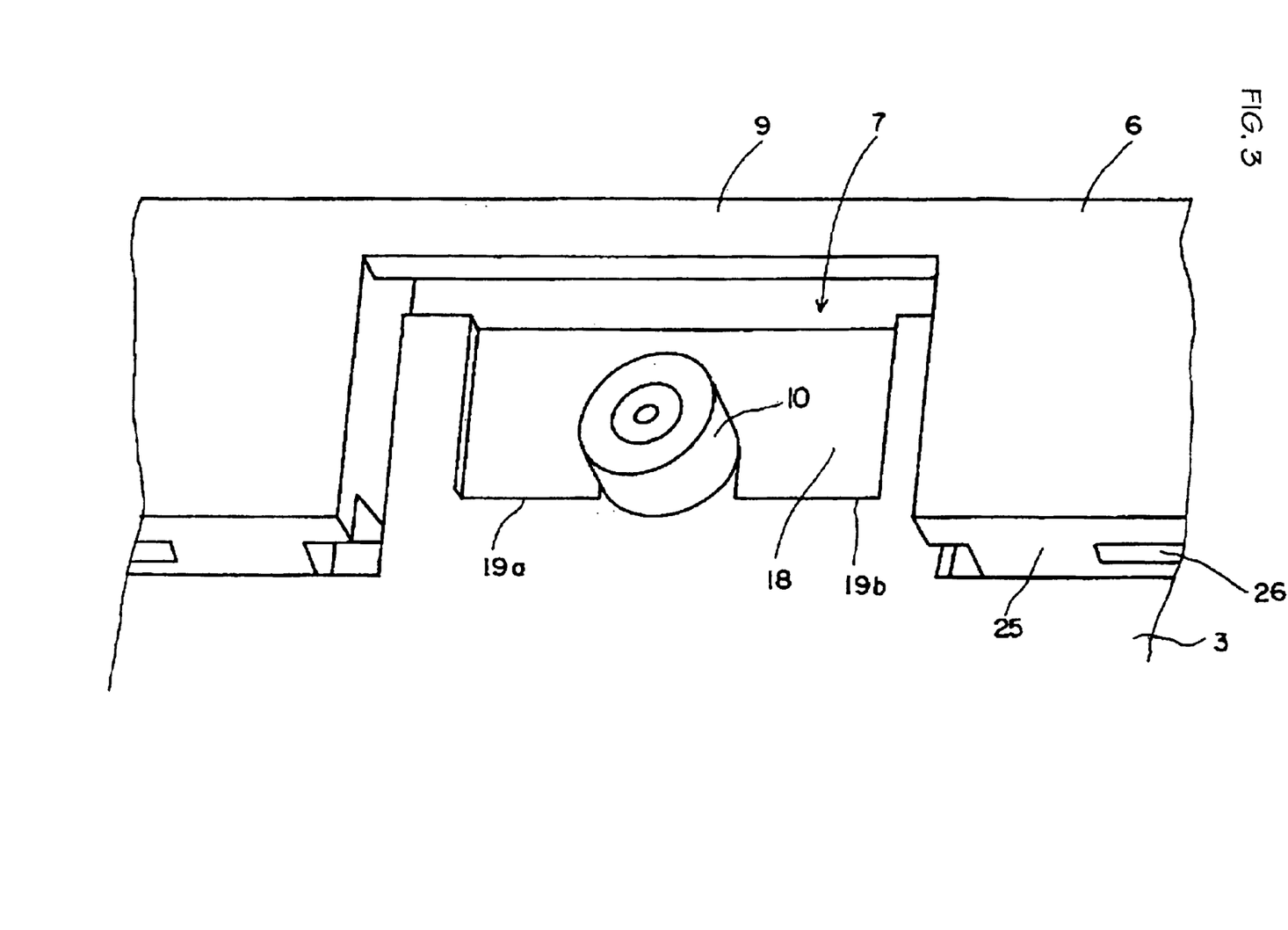
FIG. 3 is a perspective view of the front, thick end of the base housing.

Referring to FIG. 3, the front end 6 (FIG. 2) of the base housing 3 is thicker than the other portions of the base housing. The front end 6 has a rectangular recess 7 formed therein. The thick front end 6 may be hollow or solid. The generally planar slide plate 4 has a rectangular cam engagement portion 8 projecting from its front end, and the cam engagement portion 8 is complementary to the rectangular recess 7 of the base housing 3 in size and shape, thus permitting the slide plate 4 to fit on the base housing 3 although the upper surface of the thick front end 6 of the base housing 3 is at a level higher than the upper surface of the slide plate 4. The base housing 3 has a traversal section 9 bridging the space between the portions of the front end section 6 that are separated by the rectangular recess 7, those front end sections 6 being preferably trapezoid. This allows at least a portion of the front end 8a of the rectangular cam engagement portion 8 of the generally planar slide plate 3 to be positioned under the traversal section 9 while moving between the opening position and the locking position, thereby preventing the slide plate 4 from coming up from the base housing 3, as later described in detail.

Figure 4:
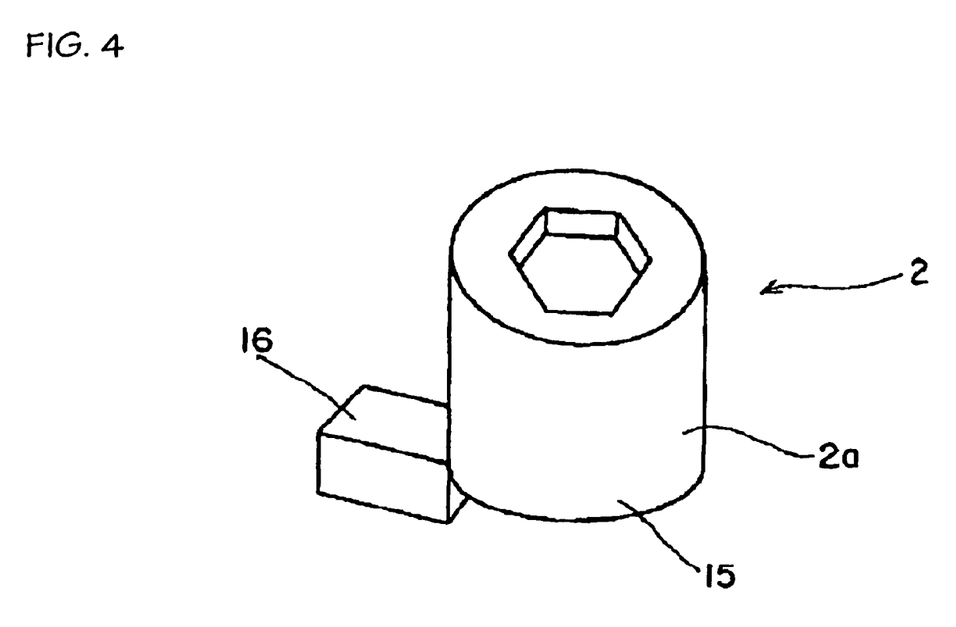
FIG. 4 is a perspective view of a cam member.
Figure 5:
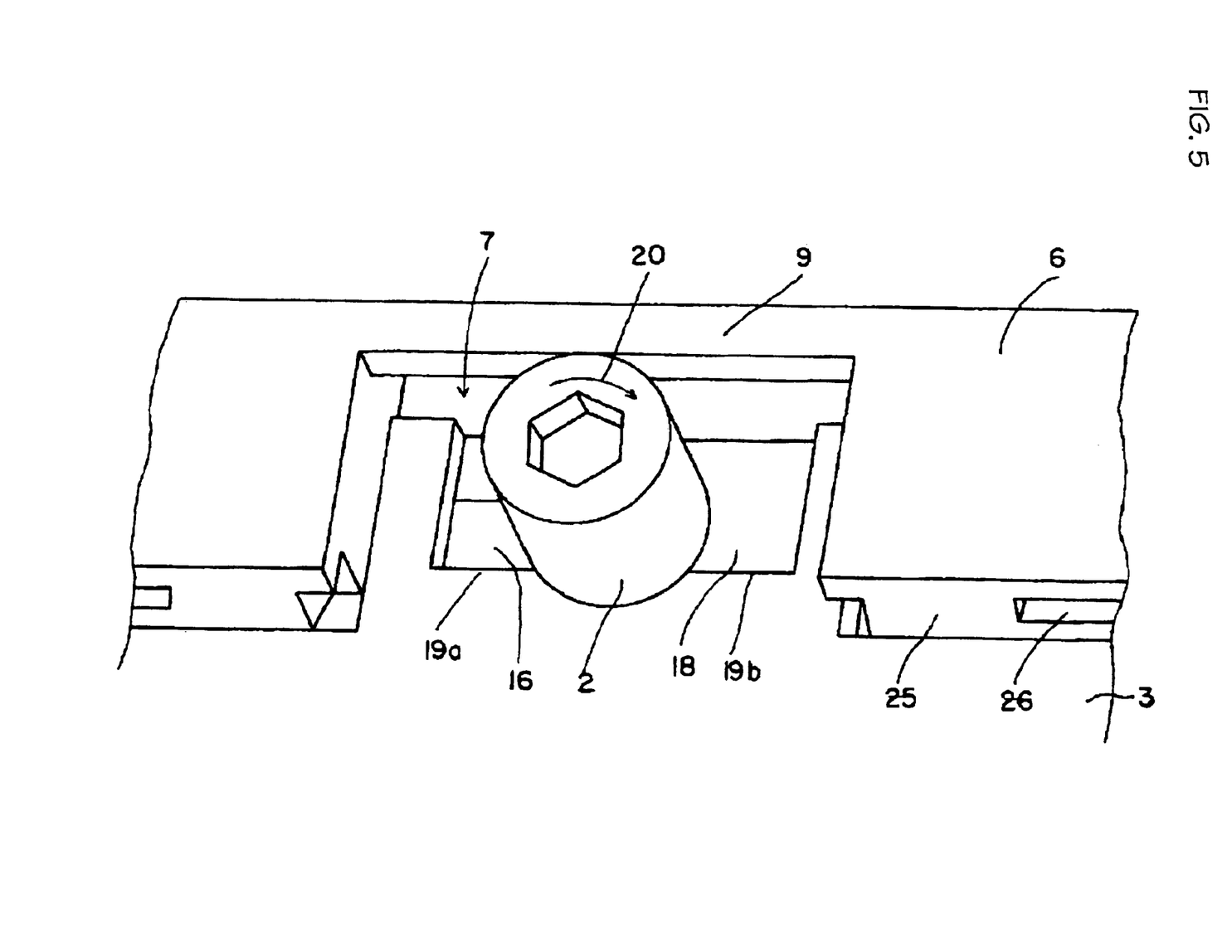

Referring to FIG. 4, the cam member 2 is a generally cylindrical post, and is fitted on the pivot axle 10 standing upright in the recess 7 of the generally planar base housing 3 so that the cam member 2 may rotate about the pivot axle 10. The cylindrical surface 2a of the cam member 2 is put in contact with the opposite cam edges 12a and 12b defined in the opening 11 of the cam engagement portion 8 of the slide plate 4. Rotation of the cam member 2 will make the slide plate 4 move back and forth on the base housing 3 as indicated by the arrow 13.

FIGS. 1(a) and (b) show how the pivot axle 10 and front end sections 6 of the base housing 3 and the cam engagement portion 8 of the slide plate 4 are related with respect to each other.

Referring to FIG. 1(a), the generally planar slide plate 4 is laid on the generally planar base housing 3 by placing the slide plate 4 on the base housing 3 with the cam engagement portion 8 of the slide plate 4 in registration with the rectangular recess 7 of the front end of the base housing 3. In this position the cam edge 12a is put in contact with the cylindrical surface of the pivot axle 10, preventing the cam member 2 from fitting on the pivot axle 10.

Referring to FIG. 1(b), the generally planar slide plate 4 is moved forward as indicated by the arrow 14 (see FIG. 1(a)) until at least a portion of the front edge 8a of the cam engagement portion 8 of the generally planar slide plate 4 has been positioned under the traversal section 9, thus leaving a space between the cam edge 12a and the cylindrical surface of the pivot axle to allow the cam member 2 to be fitted on the pivot axle 10. In this position, the slide plate 4 cannot be raised from the base housing 3, and the slide plate 4 is so positioned relative to the base housing 3 that the lead pins of a PGA package passing through the through holes 5 of the slide plate 4 are engaged with the terminals of the base housing 3 (locking position).

As may be understood from the above, the combining of the slide plate 4 and the base housing 3 does not require any pushing force as would be required in applying the hooked slide plate to the base housing in the conventional PGA package socket (see FIG. 10). This significantly contributes to the improvement of the assembling efficiency.

Referring to FIG. 4, the cam member 2 may be made of a diecast metal or any other suitable material, and it has a radial retainer 16 projecting from its lower part. The cam engagement portion 8 of the slide plate 4 has a rectangular slot 17 extending from its opening 11 (see FIGS. 2 and 6), thereby allowing insertion of the cam member 2 in the opening 11 and slot 17. On the other hand the base housing 3 has a rectangular recess 18 made around the pivot axle 10 (see FIG. 3), thus forming opposite shoulders 19a and 19b on the opposite sides of the pivot axle 10, permitting rotation of the cam member 2 within the approximately 180 degree-wide range defined by the opposite shoulders 19a and 19b. This arrangement contributes to the increasing of the strength of the retainer mechanism, assuring that the PGA socket be free of any trouble or failure in use.

The range within which the cam member 2 is allowed to rotate corresponds to the range within which the slide plate 4 is allowed to move from the locking position to the opening position or conversely. Specifically when the cam member 2 abuts against the shoulder 19a, the slide plate 4 is put in the locking position. When the cam member 2 abuts against the shoulder 19b, the slide plate 4 is put in the opening position, in which the lead pins of the PGA package can be inserted in the terminal mounts without requiring any pushing force. While the slide plate 4 is moving back and forth between the locking position and the opening position, the front edge 8a of the cam engagement portion 8 remains under the traversal section 9.

The integral connection of the radial retainer 16 to the cam member 2 and the shoulders 19a and 19b positioned to limit the rotation of the retainer 16 to 180 degree-wide range provide effectively a range-defining structure strong enough to prevent any fault from occurring in use. Whereas the embodiment shown depicts a 180 degree range from rotation of the cam member, the invention is not limited to such a range. Rather, the range can be tailored to meet the physical limitations of the particular application.

Figure 6:
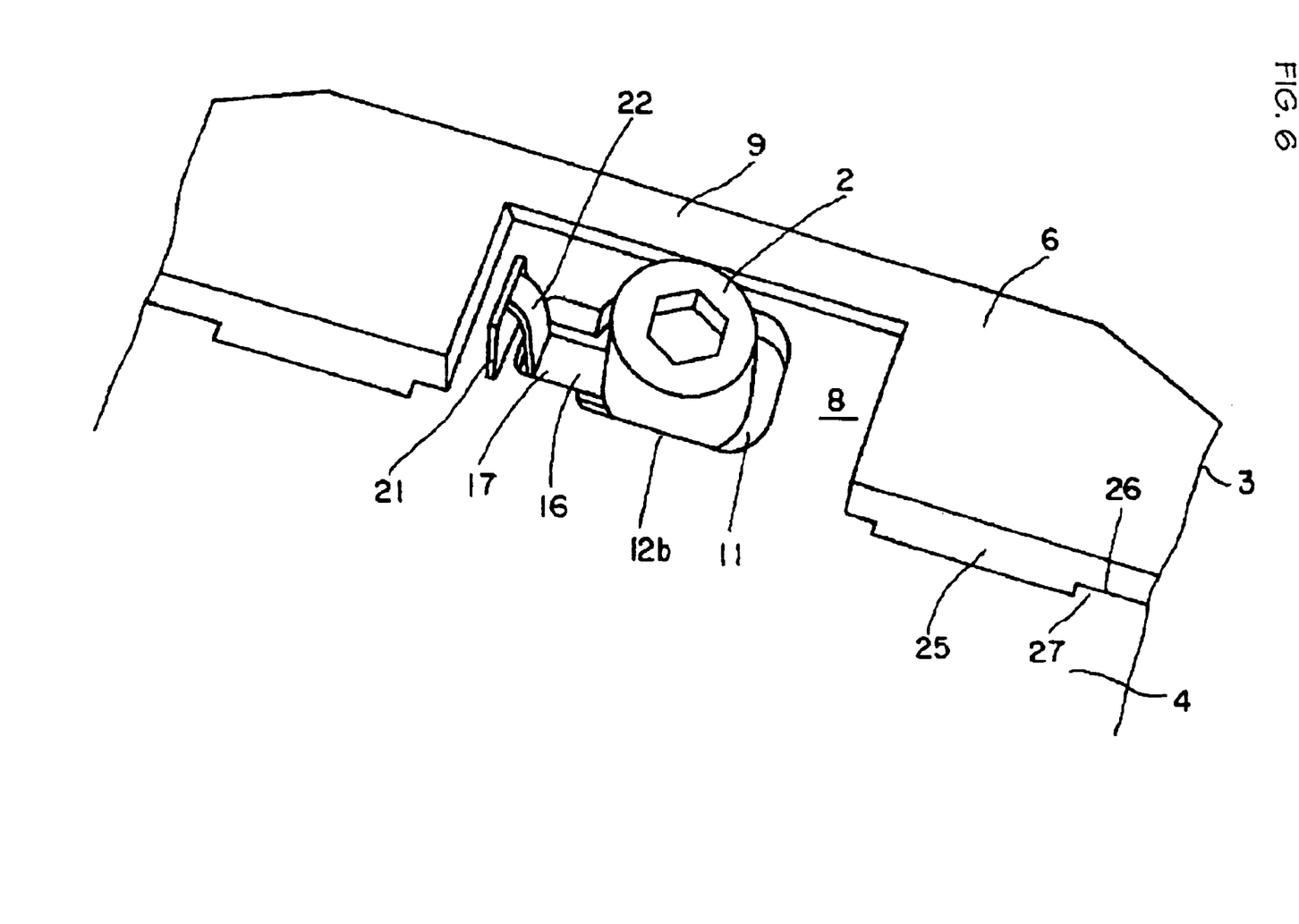
FIG. 6 is a perspective view of the front, thick end of the base housing, illustrating how the cam member is mounted.
Figure 7:
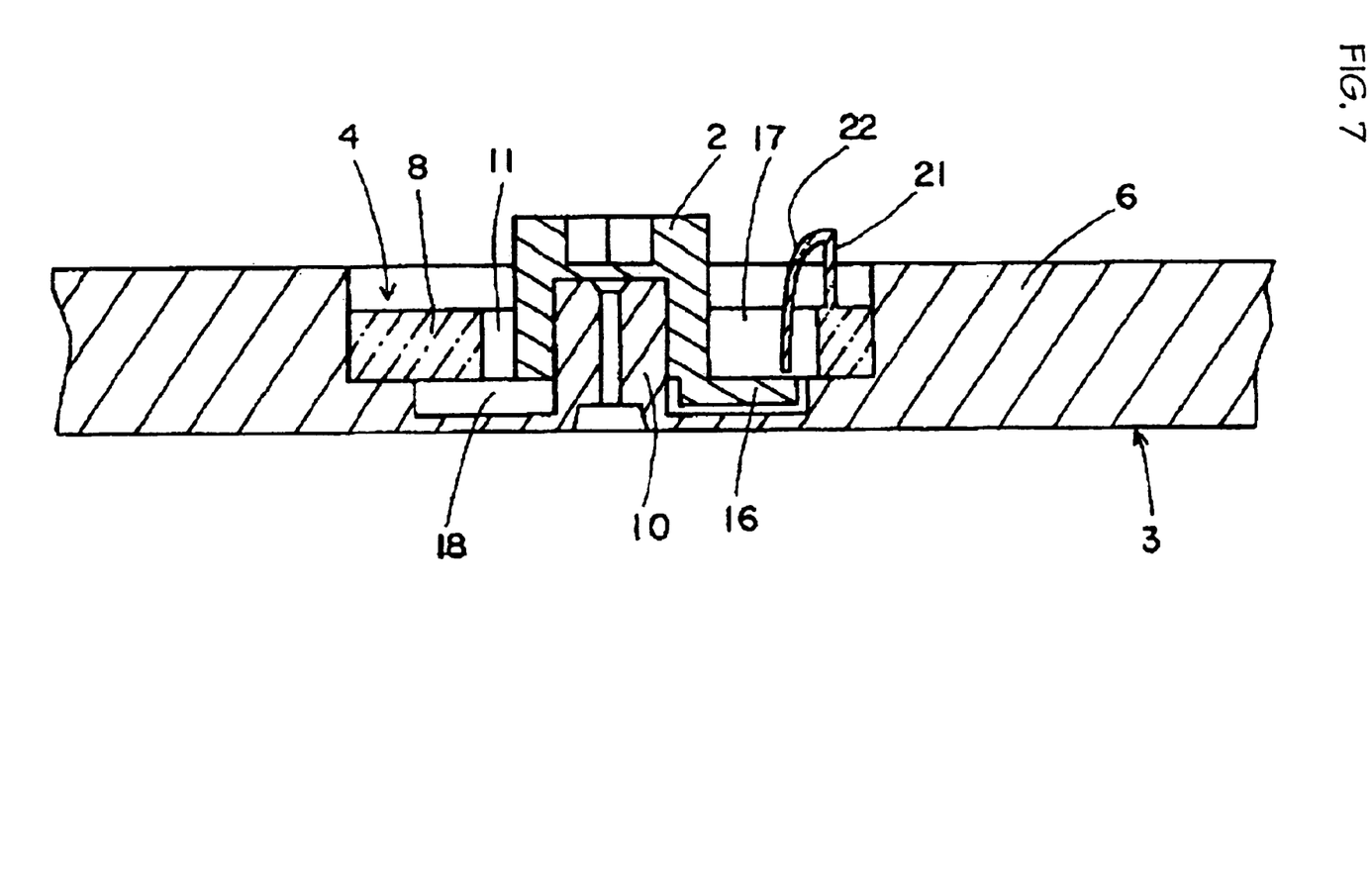
FIG. 7 is a cross section of the front, thick end of the base housing with the cam member mounted.

Referring to FIGS. 6 and 7, the slide plate 4 has means for preventing the cam member 2 from coming off the pivot axle 10 when the opening 11 of the slide plate 4 allows the cam 2 to be placed on the pivot axle 10. In the preferred embodiment, a fixed upper member 22 has a resilient member 21 extending from the fixed member. The resilient member 22 is in proximity of the radial retainer 16 appearing in the opening 11 of the slide plate 4. When the cam member 2 is fitted on the pivot axle 10, the resilient member 22 returns to its initial stress-free position, thereby retaining the cam member on the pivot axle 10 when the slide plate 4 is in the open position. When the cam member 2 is rotated to the locking position, the radial retainer 16 of the cam member 2 is under the cam engagement portion 8 of the slide plate 4, thereby retaining the cam member 2 on the pivot axle 10 when the slide plate is in the locked position.

Figure 8:
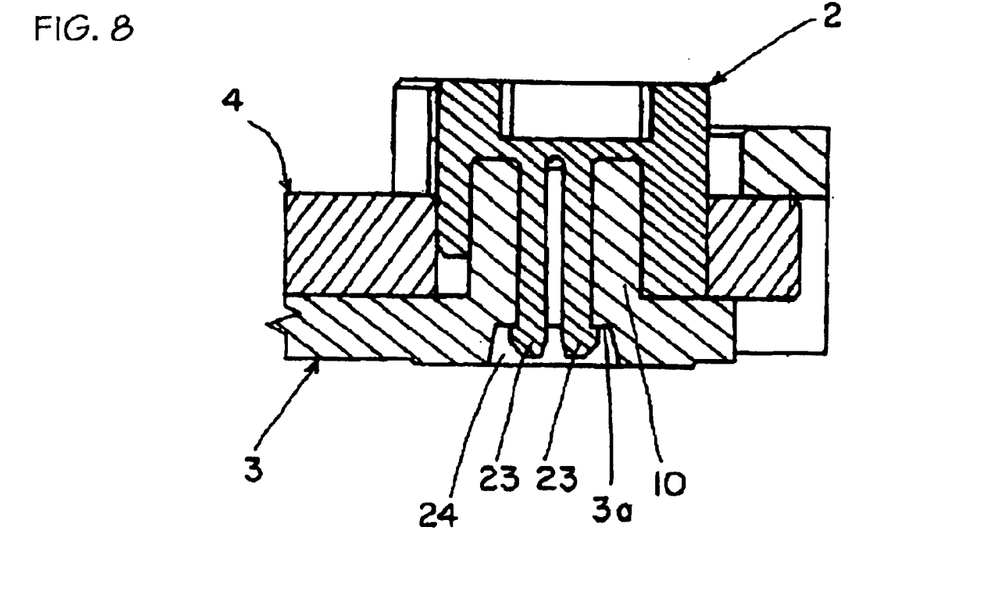
FIG. 8 is a cross section of a part of the front end of the PGA socket, illustrating the cam member having means for preventing it from slipping off from the base housing.
Figure 9:
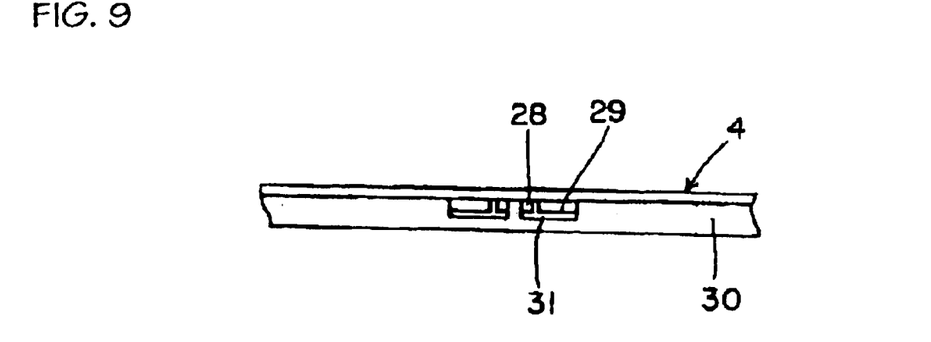
FIG. 9 shows the rear edge fragment of the base housing.

Referring to FIG. 8, the cam member 2 may have a hook-ended axle formed at its center, and the cam member 2 is rotatably fixed to the base housing 3 with the hooks 23 of the center axle being caught by a bottom surface 3a of the generally planar base housing 3, thus preventing the cam member 2 from being dislodged from the base housing 3.

A seen from FIG. 3, the thick front end sections 6 have slots 26 made in their front walls 25 whereas the slide plate 4 has projections 27 formed on its front edges (see FIG. 2). After the slide plate 4 is placed on the base housing 3, the slide plate 4 is moved forward as indicated by the arrow 14 to the opening position, and then the projections 27 enter the slots 26 of the front end sections 6, thus preventing the slide plate 4 from coming up at this location.

In addition, the base housing 3 has resilient projection pieces 28 and engagement projection pieces 29 integrally connected to the rear of the base housing 3 (see FIG. 2). Specifically, these pieces 28 and 29 are symmetrically arranged relative to the center line to extend forward above the upper surface of the base housing 3. The slide plate 4 has window openings 31 made on its rear side 30. When the slide plate 4 is moved to the opening position, these pieces 28 and 29 are allowed to get into the window openings 31, thereby preventing the slide plate 4 from coming up.

As may be understood from the above, the PGA package socket according to the present invention has its slide plate positioned under the traversal section of the base housing while moving back and forth between the opening and closing positions, thereby preventing the overlying slide plate from coming up from the underlying base housing. This arrangement makes it unnecessary to apply a pushing force to the overlying slide plate when placing the slide plate on the base housing. This has significant advantages when assembling the socket of the present invention.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A PGA package socket comprising:
   a base housing having a plurality of terminals arranged in the form of grid array, the base housing including a pivot axle and a traversal section formed in the vicinity of the pivot axle;
   a slide plate located on a top surface of the base housing, the slide plate having a corresponding plurality of through holes arranged in the same form of grid array as the base housing; and
   a cam member positioned on the pivot axle whereby rotation of the cam member about its pivot axle causes the slide plate to move between an open and a closed position and allows a front end of the slide plate to be positioned under the traversal section of the base housing while the slide plate moves between the open and the closed position.

2. The PGA package socket of claim 1, wherein the cam member is generally cylindrical.

3. The PGA package socket of claim 1, wherein the pivot axle passes through the slide plate.

4. The PGA package socket of claim 1, wherein the pivot axle is located at a front end of the base housing.

5. The PGA package socket of claim 1, wherein the pivot axle extends upward from a front end of the base housing.

6. The PGA package socket of claim 1, wherein the cam member includes a retainer projecting from an outer surface of the cam member.

7. The PGA package socket of claim 1, wherein the front end of the slide plate includes a projection for being received within a slot located in the front end of the base housing.

8. The PGA package socket of claim 1, wherein the slide plate includes an opening therein for receiving a projection piece located on the base housing.

9. The PGA package socket of claim 1, wherein the cam member is die cast metal.

10. The PGA package socket of claim 1, wherein the base housing includes shoulders formed on opposite sides of the pivot axle to limit the rotation of the cam member.

11. The PGA package socket of claim 10, wherein the shoulders permit the cam to rotate within an approximately 180 degree range.

12. The PGA package socket of claim 1, including a means for retaining the cam member on the pivot axle.

13. The PGA package socket of claim 12, wherein the means for retaining the cam member on the pivot axle includes a resilient member located in proximity to the cam member retainer.

14. The claim PGA package socket of claim 12, wherein the means for retaining the cam member on the pivot axle includes at least one hook-ended member for on the cam member.

15. The PGA package socket of claim 14, wherein the hook-ended member engages a bottom surface of the base housing.

16. A PGA package socket comprising:
   a base housing having a plurality of terminals arranged in the form of grid array, the base housing including a pivot axle and a traversal section formed in the vicinity of the pivot axle;
   a slide plate located on a top surface of the base housing, the slide plate having a corresponding plurality of through holes arranged in the same form of grid array as the base housing, and wherein the pivot axle passes through the slide plate; and
   a cam member positioned on the pivot axle whereby rotation of the cam member about its pivot axle causes the slide plate to move between an open and a closed position and allows a front end of the slide plate to be positioned under the traversal section of the base housing while the slide plate moves between the open and the closed position, the cam member including a retainer projecting from the outer surface of the cam member.

17. The PGA package socket of claim 16, wherein the base housing includes shoulders formed on opposite sides of the pivot axle to limit the rotation of the cam member.

18. The PGA package socket of claim 16, including a means for retaining the cam member on the pivot axle.

19. The PGA package socket of claim 18, wherein the means for retaining the cam member on the pivot axle is located on the slide plate.

* * * * *